(12) United States Patent
Lee (10) Patent No.: US 7,372,759 B2
(45) Date of Patent: May 13, 2008

(54) POWER SUPPLY CONTROL CIRCUIT AND CONTROLLING METHOD THEREOF

(75) Inventor: Ihl-Ho Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 264 days.

(21) Appl. No.: 11/026,429

(22) Filed: Dec. 30, 2004

(65) Prior Publication Data

US 2006/0092744 A1    May 4, 2006

(30) Foreign Application Priority Data

Oct. 30, 2004  (KR)  ............... 10-2004-0087673

(51) Int. Cl.
G11C 5/14      (2006.01)
G11C 7/22      (2006.01)
G11C 7/10      (2006.01)

(52) U.S. Cl. .................. 365/226; 365/195; 365/233; 365/193

(58) Field of Classification Search ............... 365/226, 365/227, 228, 229, 195, 233, 191, 193, 189.05, 365/230.08

See application file for complete search history.

(56) References Cited

U.S. PATENT DOCUMENTS

| 3,629,710 | A | * | 12/1971 | Durland | ............... | 327/175 |
|---|---|---|---|---|---|---|
| 4,080,575 | A | * | 3/1978 | Miki | ............... | 327/392 |
| 4,462,669 | A | * | 7/1984 | Suzuki | ............... | 396/89 |
| 5,404,338 | A |   | 4/1995 | Murai et al. | | |
| 5,521,952 | A | * | 5/1996 | Morishima | ............... | 377/55 |
| 5,570,316 | A | * | 10/1996 | Lysinger | ............... | 365/196 |
| 5,657,292 | A | * | 8/1997 | McClure | ............... | 365/233 |
| 5,668,774 | A | * | 9/1997 | Furutani | ............... | 365/233 |
| 5,852,586 | A | * | 12/1998 | Fujita | ............... | 365/233 |
| 5,910,741 | A | * | 6/1999 | Watanabe | ............... | 327/150 |
| 6,157,992 | A | * | 12/2000 | Sawada et al. | ............... | 711/167 |
| 6,493,283 | B1 |   | 12/2002 | Ford et al. | | |
| 6,711,078 | B2 |   | 3/2004 | Brennan et al. | | |
| 6,870,205 | B2 |   | 3/2005 | Lee et al. | | |
| 2004/0047404 | A1 |   | 3/2004 | Kim | | |

* cited by examiner

Primary Examiner—J. H. Hur
(74) Attorney, Agent, or Firm—Blakely, Sokoloff, Taylor & Zafman LLP (57) ABSTRACT

The present invention provides a power supply control circuit and a control method thereof, capable of securing an accurate operation of a GIO in a burst data transmission having a high compression rate. The power supply control circuit of a semiconductor memory device includes: a counter which is reset in response to a read command signal or a write command signal to count an input clock and then, to output a counting completion signal; and a power supply enable signal generator enabled in response to the read command signal or the write command signal and disabled in response to the counting completion signal, for generating a power supply enable signal.

16 Claims, 10 Drawing Sheets

POWER SUPPLY CONTROL CIRCUIT AND CONTROLLING METHOD THEREOF

FIELD OF THE INVENTION

The present invention relates to a power supply circuit for supplying a voltage to a data input/output circuit in a semiconductor memory device; and, more particularly, to a power supply circuit with a power supply controller for supplying a voltage to a global input/output (GIO) bus, and a controlling method thereof.

DESCRIPTION OF RELATED ART

A semiconductor memory device includes external input/output (I/O) pins for interfacing with an external circuit and a plurality of memory cells for storing data. In the semiconductor memory device, an area around the external I/O pins is called a peripheral area and an area around the memory cells is called a core area.

Figure 1:
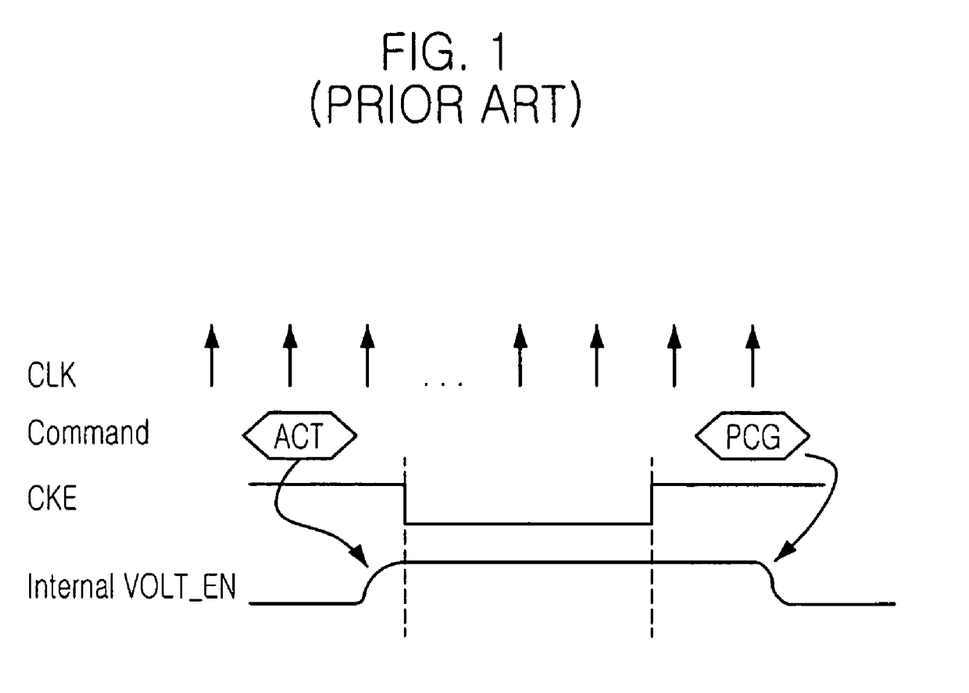
FIG. 1 is a timing diagram setting forth a conventional power supply control circuit.

In a structure of a semiconductor memory chip, the peripheral area and the core area are spaced apart from each other by a predetermined distance. The global I/O (GIO) bus consisting of I/O lines for data transmission between the peripheral area and the core area have considerable resistance and capacitance. Therefore, a large amount of a driving power is required for driving the GIO bus. Also, as shown in FIG. 1, while a general voltage generator inside a semiconductor memory device is enabled during an activation period of a row address from an active command ACT to a precharge command PCG, the GIO bus is used during an activation period of a column address. Thus, it is difficult to apply the general voltage circuit to the semiconductor memory device.

Figure 2:
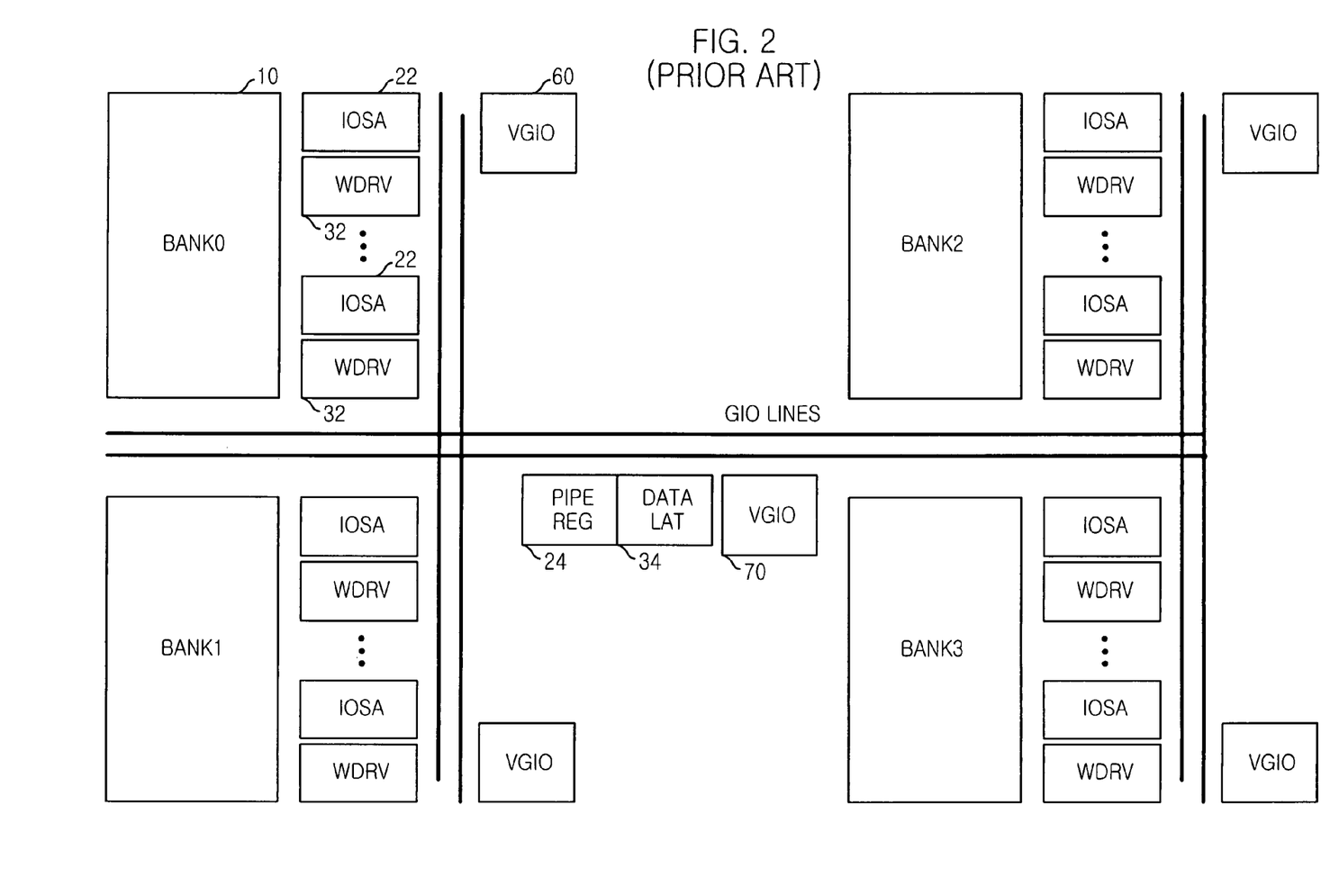
FIG. 2 is a circuit layout showing a conventional global input/output (GIO) bus driving circuit of a semiconductor memory device.
Figure 3:
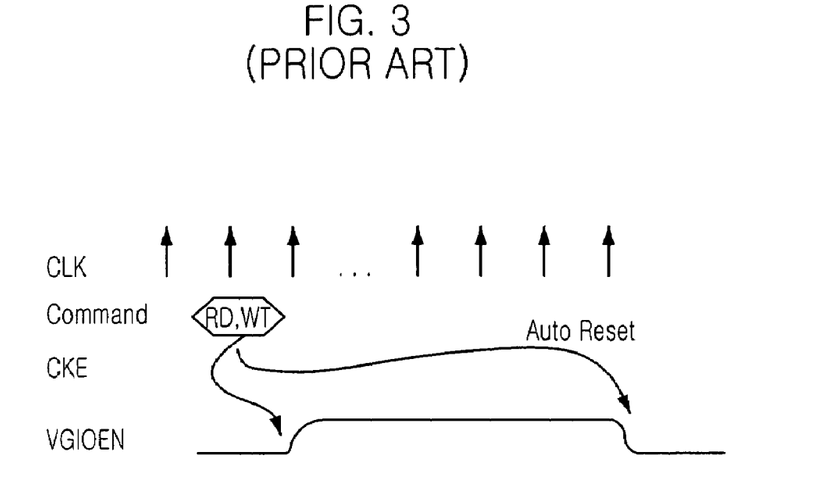
FIG. 3 is a timing diagram illustrating an operation for controlling the GIO bus driving circuit.
Figure 4:
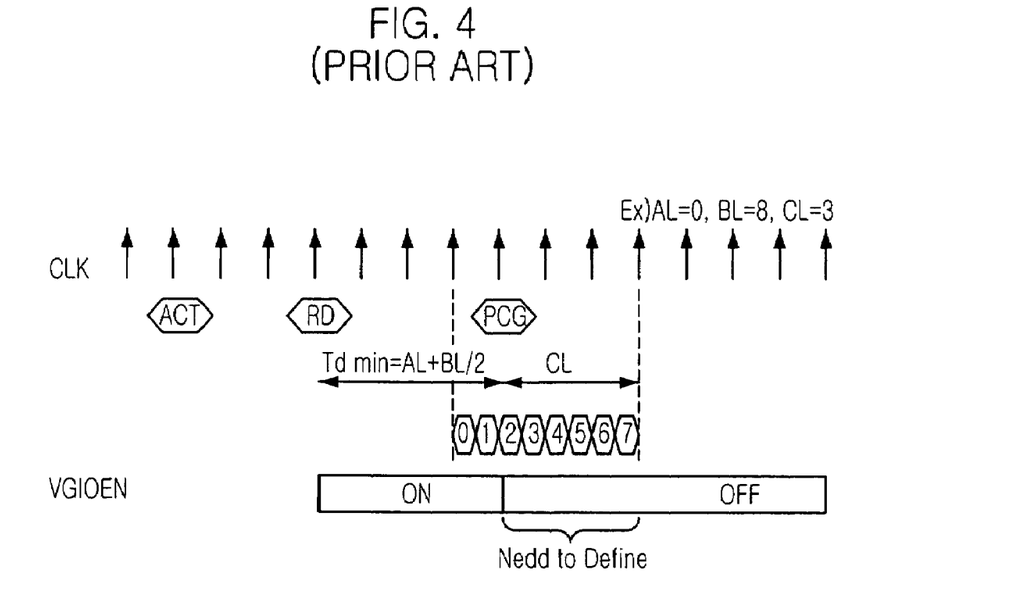
FIG. 4 is a timing diagram describing a problem caused by a conventional power supply control circuit.

A GIO driving circuit having a power supply circuit was disclosed in Korean Patent Application No. 2004-49912, filed by the present applicant. As shown in FIG. 2, the GIO driving circuit includes a GIO bus forming data I/O paths between a core area and a peripheral area, data drivers 22, 24, 32 and 34 disposed on both ends of the GIO bus, and a voltage generator 60 enabled during data input or output period through the GIO bus to generate a voltage to the data drivers 22, 24, 32 and 34. As shown in FIG. 3, the voltage generator 60 is enabled while a column address is activated in response to a column address strobe (CAS) signal.

While a delay time inevitably occurs due to a read/write operation of a memory cell itself, a technical development of nonmemory device demands a high-speed data input/output operation in a semiconductor memory device. To meet the demand, DDR or DDR2 technology has been recently used. In a read operation according to the DDR or DDR2 technology, data read from the core in parallel is latched in an external data interface unit and outputted to an external circuit in a high-speed serial data transmission. In a write operation, data received in the serial data transmission is also latched in an external data interface unit and written to the core in parallel.

In this case, a timing of reading/writing data from/to the memory cell of the core is different from that of loading data on the GIO bus managing data transmission between the core area and the peripheral area, where the external data interface unit exists.

Accordingly, in case where the above technology is applied to the DDR or DDR2 technology, that is, in case where a burst data transmission with a high compression rate is applied, a timing of loading data on the GIO bus is different from that of supplying a driving voltage to the GIO bus, resulting in an erroneous operation.

SUMMARY OF THE INVENTION

It is, therefore, an object of the present invention to provide a power supply control circuit and a control method thereof, capable of securing an accurate operation of a GIO in a burst data transmission having a high compression rate.

It is another object of the present invention to provide a power supply circuit and a controlling method thereof, capable of supplying a voltage to other circuit modules without influencing their operations.

It is a further another object of the present invention to provide a power supply circuit and a controlling method thereof, in which a semiconductor memory device is not influenced due to a noise from other devices.

It is a still further another object of the present invention to provide a power supply circuit and a controlling method thereof, capable of effectively using a power.

In accordance with an aspect of the present invention, there is provided a power supply control circuit of a semiconductor memory device including: a counter which is reset in response to a read command signal or a write command signal to count an input clock and then, to output a counting completion signal; and a power supply enable signal generator enabled in response to the read command signal or the write command signal and disabled in response to the counting completion signal, for generating a power supply enable signal.

In accordance with another aspect of the present invention, there is provided an I/O bus driving circuit including: an I/O bus for providing a data transmission path between a core area and a peripheral area in a semiconductor memory device; a data core connecting stage disposed at an end portion of the core area of the I/O bus; a data peripheral connecting stage disposed at an end portion of the peripheral area of the I/O bus; a bus voltage generator enabled during the data input or output period through the I/O bus to supply a driving voltage to the data core connecting stage and the data peripheral connecting stage; and a power supply controller for controlling a power supply circuit.

In accordance with still another aspect of the present invention, there is provided an I/O bus driving circuit including: a global I/O bus through which data is inputted/outputted between a core area and a peripheral area; a read sensing unit for sensing and amplifying data loaded on an internal I/O line of the core area; a read latch for detecting and latching the data loaded on the global I/O bus and outputting the latched data through an I/O pin; a write latch for determining and latching the data inputted from the I/O pin and outputting the latched data to the global I/O bus; a write driver for transferring the data loaded on the write global I/O bus to the internal data I/O line of the core area; a bus voltage generator which is enabled in response to a read enable signal for supplying a driving voltage to the read sensing part and the read latch part after receiving an external voltage, and which is enabled in response to the write enable signal for supplying the driving voltage to the write latch part and the write driver part; and a power supply controller for controlling a power supply circuit.

In accordance with further still another aspect of the present invention, there is provided a method for controlling a power supply circuit comprising the steps of: a) receiving a read command or a write command; b) performing a counting operation for an input clock after receiving the read command or the write command; c) activating a power supply enable signal after receiving the read command or the write command; and d) deactivating the power supply enable signal after finishing the counting operation.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 5:
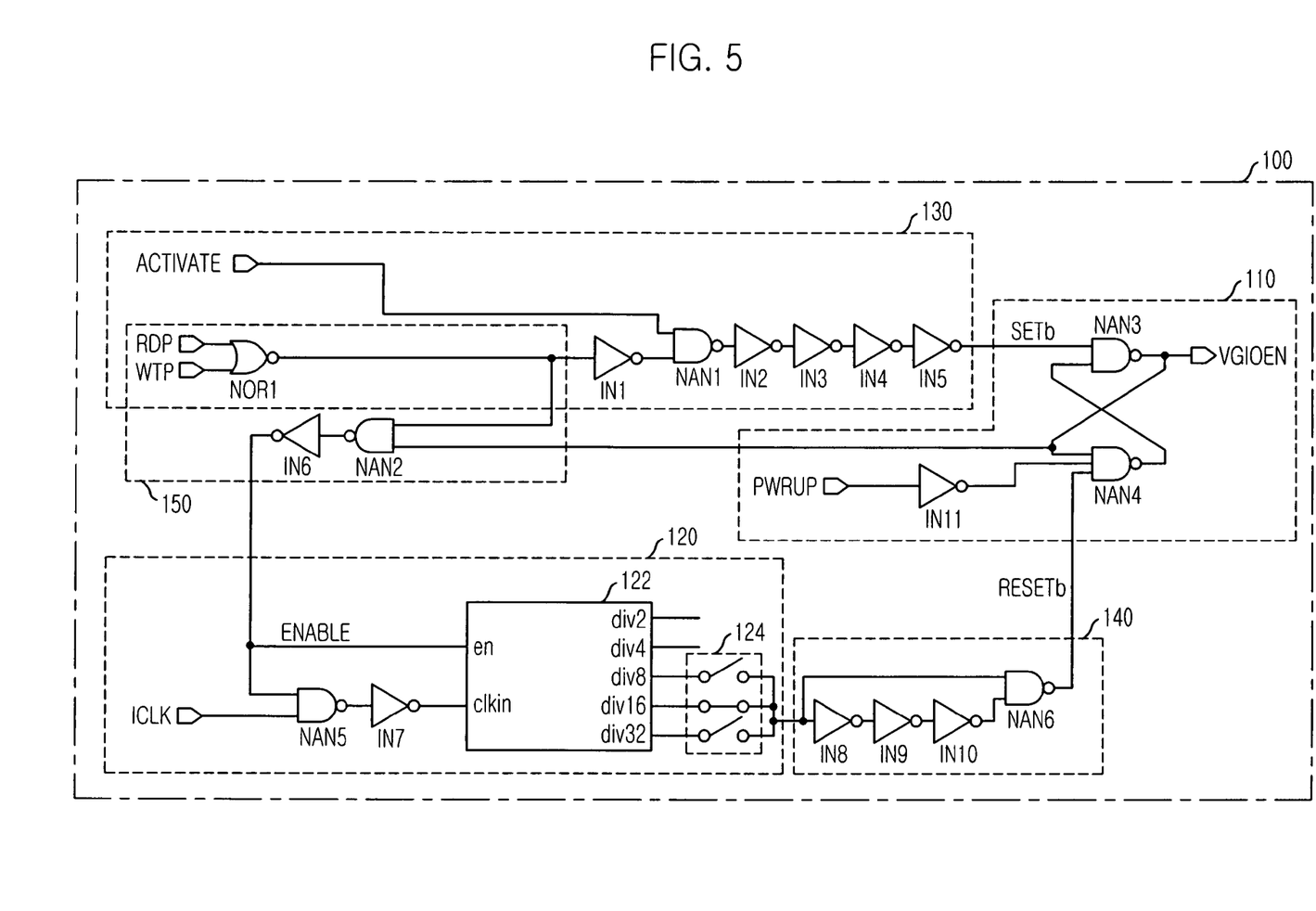
FIG. 5 is a circuit diagram depicting a power supply control circuit in accordance with the present invention.

FIG. 5 is a power supply controlling circuit 100 of a semiconductor memory device incorporating therein a plurality of internal power suppliers in accordance with a preferred embodiment of the present invention.

Referring to FIG. 5, the inventive power supply controlling circuit 100 includes a power supply enable signal generator 110, a counter 120, a setting signal generator 130, a reset signal generator 140 and a counter controller 150. Herein, the counter 120 counts an input clock and outputting a counting completion signal after performing a counting operation in which the counter 120 is reset by receiving a read pulse RDP or a write pulse WTP. The power supply enable signal generator 110 outputs a power supply enable signal VGIOEN which is disabled by the counting completion signal of the counter 120. In the present invention, the power supply enable signal generator 110 is implemented as a set-reset latch (SR latch) to output the power supply enable signal. VGIOEN. The power supply enable signal generator 110 is set by the read pulse RDP or the write pulse WTP and is reset by the counting completion signal.

The power supply enable signal generator 110 of the SR latch includes two NAND gates NAN3 and NAN4 that are set or reset by a setting signal SETb or a reset signal RESETb, wherein the setting signal SETb and the reset signal RESETb are outputted from the setting signal generator 130 and the reset signal generator 140, respectively. Furthermore, each of the NAND gate NAND3 and NAND4 is cross-coupled to each other. As shown in FIG. 5, if necessary, the power supply enable signal generator 110 can be implemented to be reset by an external power-up signal PWRUP.

The setting signal generator 130 is provided with a NOR gate NOR1, an inverter IN1, a NAND gate NAN1 and a delay IN2 to IN5. The NOR gate NOR1 performs a logic NOR operation to the read pulse RDP and the write pulse WTP and the inverter IN1 inverts the output of the NOR gate NOR1. The NAND gate NAN1 performs a logic NAND operation to a row active signal ACTIVATE and the output of the inverter IN1. The delay is configured with a plurality inverters IN2 to IN5 for delaying the output of the NAND gate NAN1 for a first predetermined delay time.

The reset signal generator 140 is provided with an inverter IN8 for inverting the counting completion signal of the counter 120, a delay with a plurality of inverters IN9 and IN10 for delaying the output of the inverter IN8 for a second predetermined delay time and a NAND gate NAN6 performs a logic NAND operation to the output of the inverter I10 of the delay and the counting completion signal so as to output the reset signal RESETb. Such a reset signal generator 140 plays a role as a rising edge detector because the reset signal generator 140 outputs the latch reset signal RESETb with a predetermined pulse that is enabled at a rising edge of the counting completion signal.

In general, the counter 120 receives a clock to count, a counting control signal and a counter reset signal. Furthermore, a counting number is inputted to the counter 120 from an exterior or is recorded at an interior. In the preferred embodiment, a generation/maintenance time of a driving power for global input/output (GIO) bus is determined according to the counting number which can be changed to meet various conditions of an external chip or specifications. Therefore, it is preferable to implement the counter 120 as a variable counter capable of changing the counting number. In accordance with the preferred embodiment, the counter 120 is provided with a clock divider 122 for dividing the input clock by a predetermined multiple, e.g., an even number, and an output selector 124 configured with a plurality of switches for selecting one divided clock among divided clocks of the clock divider 122.

The counter 120 resets the counting number by receiving the read pulse RDP or the write pulse WTP and performs a counting operation while the power supply enable signal VGIOEN is activated. In addition, the counter 120 may be reset by using the counter control signal without receiving the counter reset signal additionally. That is, the counter 120 performs a counting operation at a logic high level of the counter control signal and is reset at a logic low level of the counter control signal.

The counter controller 150 is provided with a NAND gate NAN2 for performing a logic NAND operation to the output of the NOR gate NOR1 of the setting signal generator 130 and the power supply enable signal VGIOEN and an inverter IN6 for inverting the output of the NAND gate NAN2.

Figure 6:
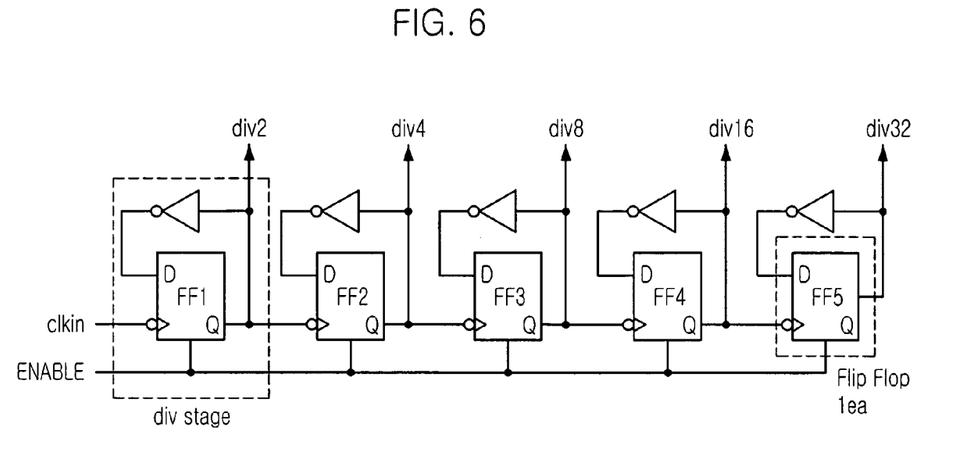
FIG. 6 is a block diagram explaining a clock divider of the power supply control circuit in accordance with the present invention.

FIG. 6 is a circuit diagram setting forth the clock divider 122 of the power supply controlling circuit 100 in accordance with the preferred embodiment of the present invention.

Referring to FIG. 6, the clock divider 122 is provided with N number of divider stages for outputting a respective divided clock, wherein a maximum number of divided clocks are $2^N$. Each divider stage is configured with an inverter and a D flip-flop having a data input terminal, a data output terminal and a clock input terminal. Herein, the output of each divider stage FF1 to FFN is inverted at the inverter and then, is inputted to the data input terminal thereof. In detail, a first divider stage FF1 receives a count clock clkin through the clock input terminal and receives the output of the inverter through the data input terminal. The other divider stages except the first one FF1 receive receives the output of an N−1th divider stage through the respective clock input terminal and receives the output of the respective inverter through the respective data input terminal. In FIG. 6, for the sake of convenience, there are shown only five divider stages FF1 to FF5 for dividing a frequency of the input clock by $2^5$, i.e., 32 so as to output divided clocks div2 to div32.

Figure 7:
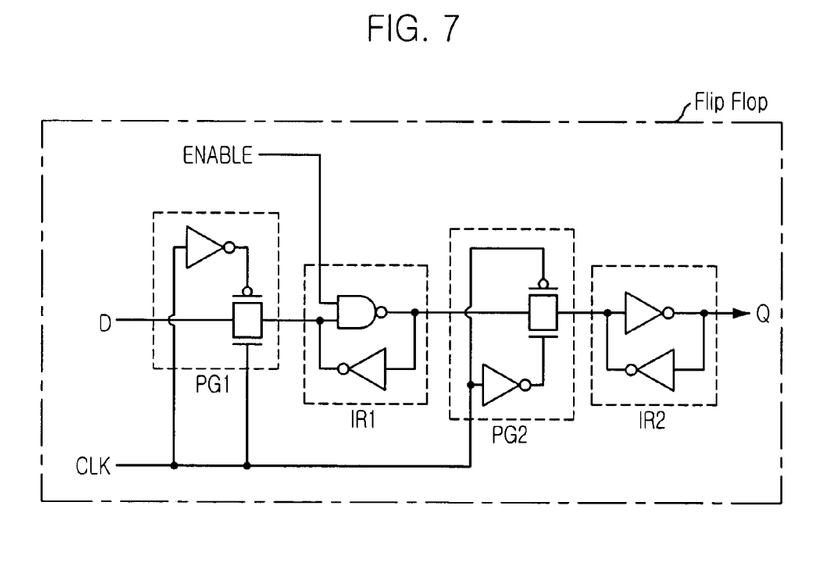
FIG. 7 is a circuit diagram setting forth a flip-flop in the clock divider in accordance with the present invention.

FIG. 7 is a circuit diagram setting forth the D flip-flop of the divider stage depicted in FIG. 6 in accordance with the preferred embodiment of the present invention.

Referring to FIG. 7, the D flip-flop is provided with an input latch IR1 for latching a data inputted through the data input terminal, an output latch IR2 for latching a data to be outputted through the data output terminal, a first pass gate PG1 for selectively connecting the data input terminal to the input latch IR1 and a second pass gate PG2 for selectively connecting the output latch IR2 to the data output terminal.

Furthermore, the input latch IR1 is configured with an inverter and a NAND gate instead of using an inverter so that the counter control signal ENABLE is inputted to one end of the NAND gate. Therefore, in case that the counter control signal ENABLE becomes in logic low level, the D flip-flop is reset so as to output a signal of logic low level.

Figure 8:
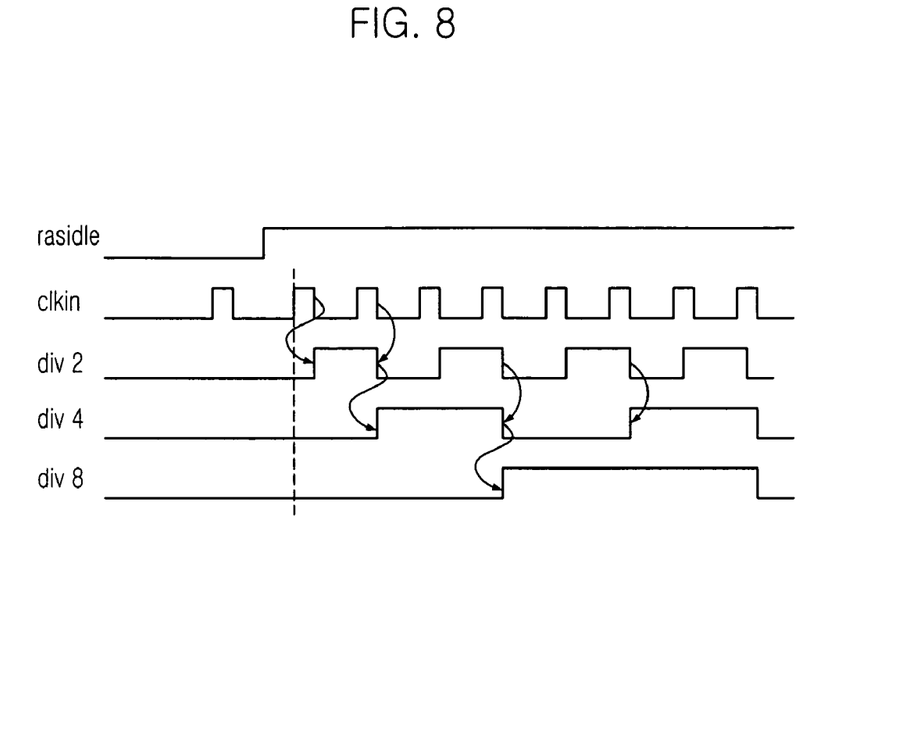
FIG. 8 is a timing diagram showing an operational sequence of a plurality of divided clocks in accordance with the present invention.

FIG. 8 is a timing diagram setting forth a plurality of divided clocks of the clock divider 122 in accordance with the preferred embodiment of the present invention.

Referring to FIG. 8, if the counter controlling signal ENABLE becomes in logic low level, the output of the first D flip-flops FF1 becomes in logic low level, i.e., 0. Accordingly, the first D flip-flop FF1 receives the inverted signal of logic high level, i.e., 1. Likewise, the first D flip-flop FF1 receives the inverted signal of logic high level by means of a feedback operation; outputs it at a falling edge of the count clock clkin; and then receives a re-inverted signal of logic low level through the feedback operation. After repeating these operations, the first D flip-flop FF1 output a first divided clock div2 that the count clock is divided by 2. Like a same manner, the second D flip-flop FF2 outputs a second divided clock div4 that the count clock is divided by 4 and finally, the Nth D flip-flop FFN outputs an Nth divided clock div$2^N$ that the count clock is divided by $2^N$.

Figure 9:
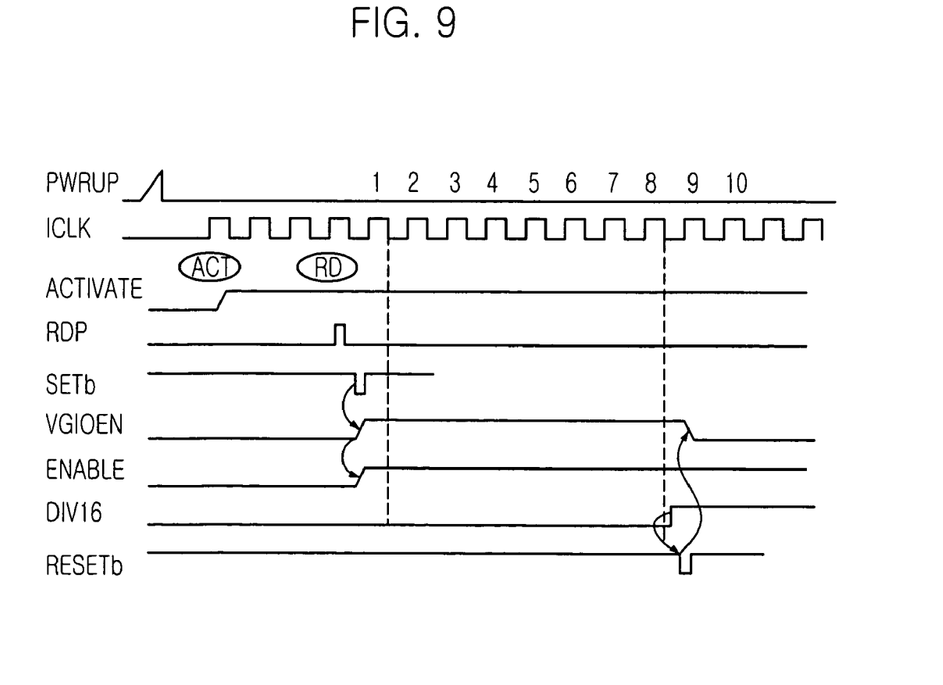
FIG. 9 is a timing diagram illustrating an operation of the power supply control circuit when a read command is inputted in accordance with the present invention.

FIG. 9 is a timing diagram setting forth a method for controlling a power supply circuit in accordance with the preferred embodiment of the present invention.

To begin with, a power supply enable signal VGIOEN is enabled soon after a read command RD is inputted. Subsequently, the counter 120 performs a counting operation for an input clock after receiving the read command RD. Then, the power supply enable signal VGIOEN is disabled after finishing a predetermined number of counting.

In detail, a power-up signal PWRUP is to reset the power supply enable signal generator 110 of SR latch. Then, an active command ACT activates an active signal ACTIVATE to be in logic high level so that the count clock ICLK is generated. In the other cases, the count clock may be generated in response to the power-up signal PWRUP.

The setting signal generator 130 receives the read pulse RDP in response to the read command RD so that the setting signal SETb becomes in logic low level, thereby setting the power supply enable signal generator 110. Thereafter, the power supply enable signal VGIOEN is activated to be in logic high level which drives a GIO power generation circuit. Furthermore, the counter controller 150 receives the read pulse signal RDP so as to deactivate the counter control signal ENABLE. The deactivated counter control signal ENABLE resets a counting value.

Afterwards, the activated power supply enable signal VGIOEN is in putted to the counter controller 150 so that the counter control signal ENABLE becomes in logic high level. Then, the counter 120 starts to perform the counting operation after receiving the activated counter control signal ENABLE.

For example, when the output selector selects a 1/16 divided clock div16, the 1/16 divided clock becomes in logic high level after 8 number of the counting clock ICLK passes. Then, the reset signal RESETb becomes in logic low level so that the power supply enable signal VGIOEN is deactivated to be in logic low level. The deactivated power supply enable signal VGIOEN makes a GIO bus voltage generation circuit stop to operate. In addition, the deactivated power supply enable signal VGIOEN is inputted into the counter controller 150 to deactivate the counter control signal ENABLE and to reset the counter 120.

Figure 10:
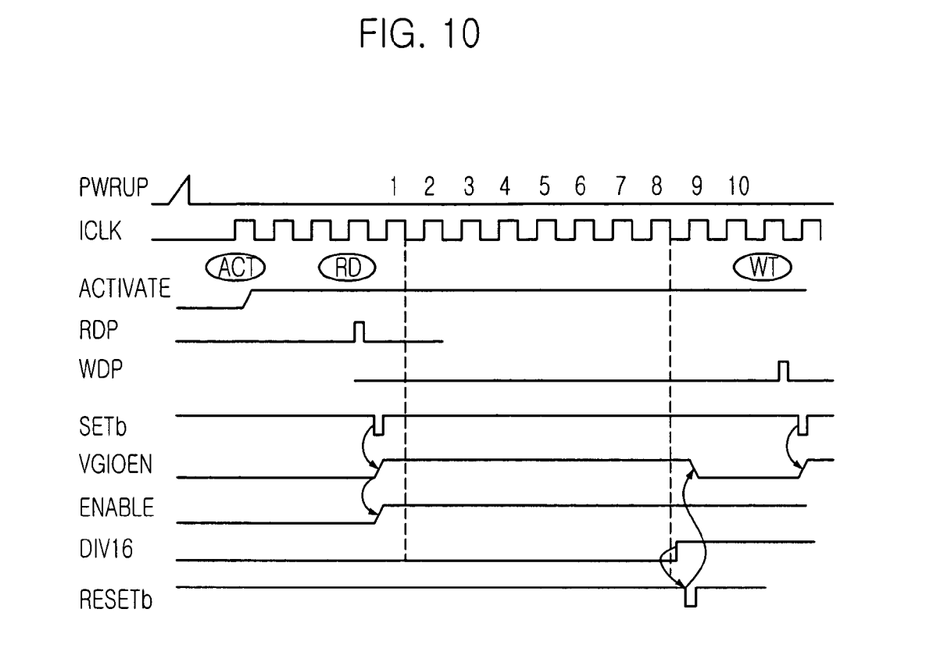
FIG. 10 is a timing diagram explaining an operation of the power supply control circuit when a write command is inputted sufficiently later after a read command is inputted in accordance with the present invention.

A controlling procedure in case that the write pulse signal is inputted is performed similar to that case the read pulse signal in inputted. In particular, when the write pulse signal WTP is inputted sufficiently later after the read pulse signal RDP is inputted, the controlling procedure for the power supply circuit when the write pulse signal WTP is inputted is performed simultaneously with the controlling procedure for the read pulse signal RDP.

Figure 11:
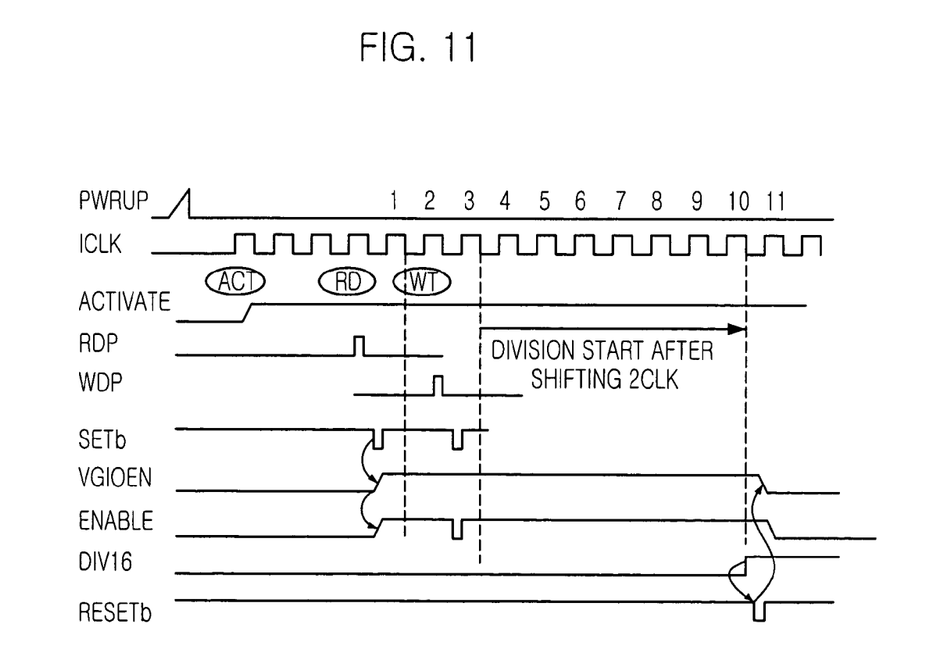
FIG. 11 is a timing diagram describing an operation of the power supply control circuit when a write command is inputted soon after a read command is inputted in accordance with the present invention.

FIG. 11 is a timing diagram setting forth an operation sequence when the write pulse WTP is inputted before finishing the counting operation for the read pulse RDP.

In this case, since the driving voltage is still applied to the GIO bus while performing the counting operation, the operation procedure for the write pulse can be performed if the driving voltage is sufficiently applied to the GIO bus. Therefore, the power supply control circuit 100 performs the counting operation according to the write pulse WTP which is inputted later than the read pulse RDP. As aforementioned in FIG. 9, the controlling method is performed as following subsequent steps of: receiving the read pulse RDP; activating the power supply enable signal VGIOEN soon after receiving the read command RD; performing the counting operation after receiving the read command RD; and deactivating the power supply enable signal VGIOEN after finishing the counting operation.

Therefore, if the write pulse WTP is inputted before deactivating the power supply enable signal VGIOEN soon after performing the counting operation, the counter 120 is reset and then, the counting operation for the input clock is performed again. Afterwards, the power supply enable signal VGIOEN is deactivated after finishing the counting operation. The deactivated power supply enable signal VGIOEN makes the GIO bus voltage generator operate and makes the counter be reset.

Figure 12:
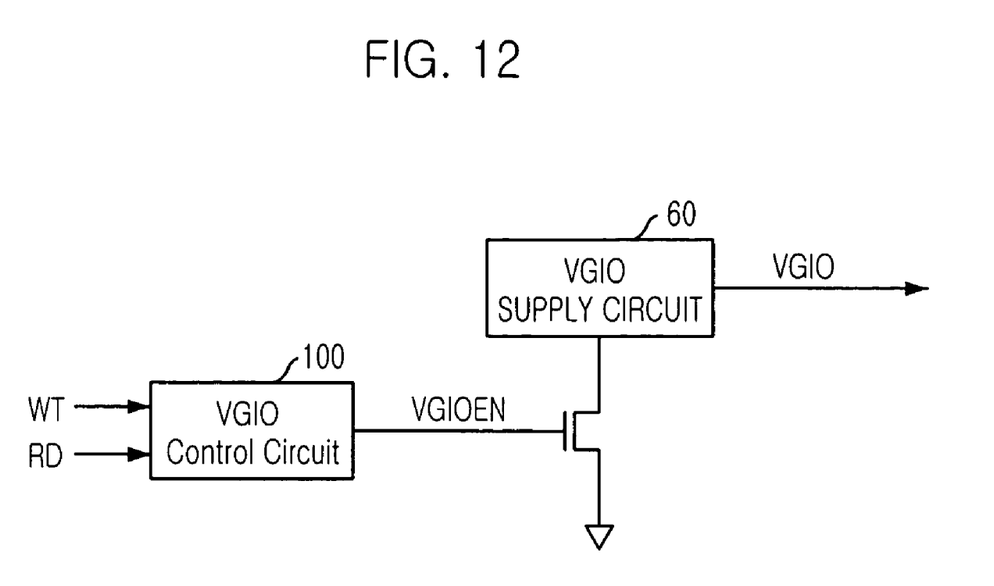
FIG. 12 is a block diagram depicting an interconnection between a power supply control circuit and a GIO power supply circuit in accordance with the present invention.

FIG. 12 is a block diagram setting forth an input/output (IO) bus driving circuit which is controlled by the power supply control circuit 100 depicted in FIG. 5 in accordance with the present invention.

Referring to FIGS. 2 and 12, the IO bus driving circuit of the present invention includes a global IO (GIO) bus for providing a data transmission path between a core area and a peripheral area, a data core connecting stage 22 and 32 disposed at an end of the core area of the GIO bus, a data peripheral connecting stage 24 and 34 disposed at an end of the peripheral area of the GIO bus, a GIO bus voltage generator 60 and 70 which is enabled while inputting or outputting the data by using the GIO bus, for supplying a driving voltage to the core connecting stage 22 and 32 and the peripheral connecting stage 24 and 34, and a power supply control circuit 100.

As shown in FIG. 12, an interconnection between the power supply control circuit 100 and the GIO bus voltage generator 60 is implemented such a manner that the power supply control signal VGIOEN is applied to an MOS gate so as to cut off a ground voltage VSS or to cut off a power supply voltage VDD.

Figure 13:
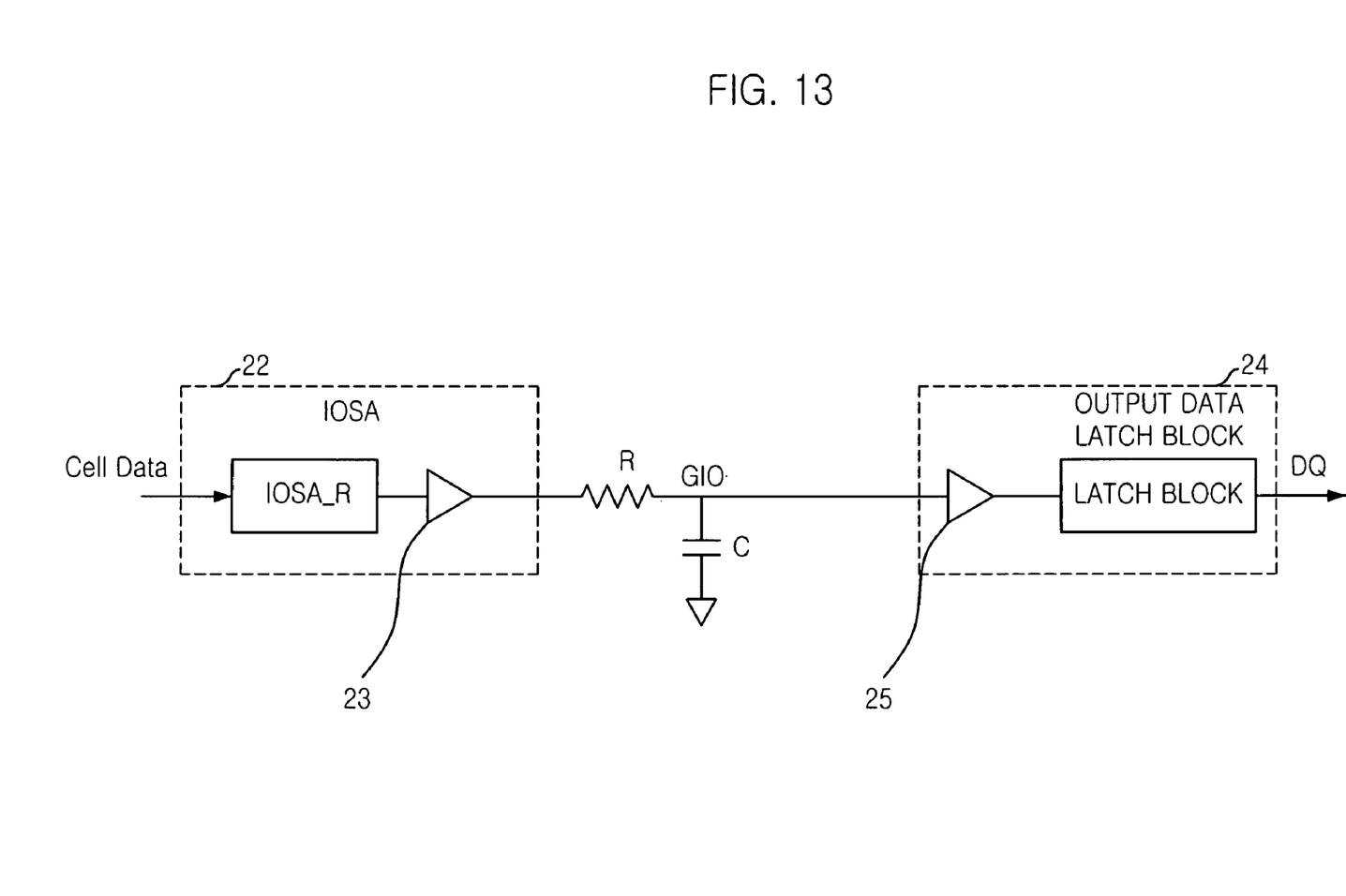
FIG. 13 is a block diagram showing a read bus driving circuit in accordance with the present invention.

FIG. 13 is a block diagram setting forth the semiconductor memory device incorporating therein a read GIO bus driving circuit in accordance with the present invention.

In FIG. 13, the core area of a read GIO bus having a resistor with a predetermined resistance R and a capacitor with a predetermined capacitance C is connected to a read sensing unit 22 and a peripheral area thereof is connected to a read latch unit 24. Meanwhile, the read sensing unit 22 is provided with a sense amplifier IOSA_R connected to the core area for sensing and amplifying the data applied to a data line in the core, and a line driver 23 for outputting the sensed data to GIO bus. The read latch unit 24 is provided with a line receiver for sensing the data applied to the GIO bus and a pipe line latch module. The driving voltage is applied to each of elements depicted in FIG. 13. In detail, in order to raise operational stability of the read sensing unit 22 and read latch unit 24, the driving voltage is applied to all the elements required for the power voltage at the read sensing unit 22 and the read latch unit 24. Alternatively, the driving voltage may be applied only to the line driver 23 and the line receiver 25.

Figure 14:
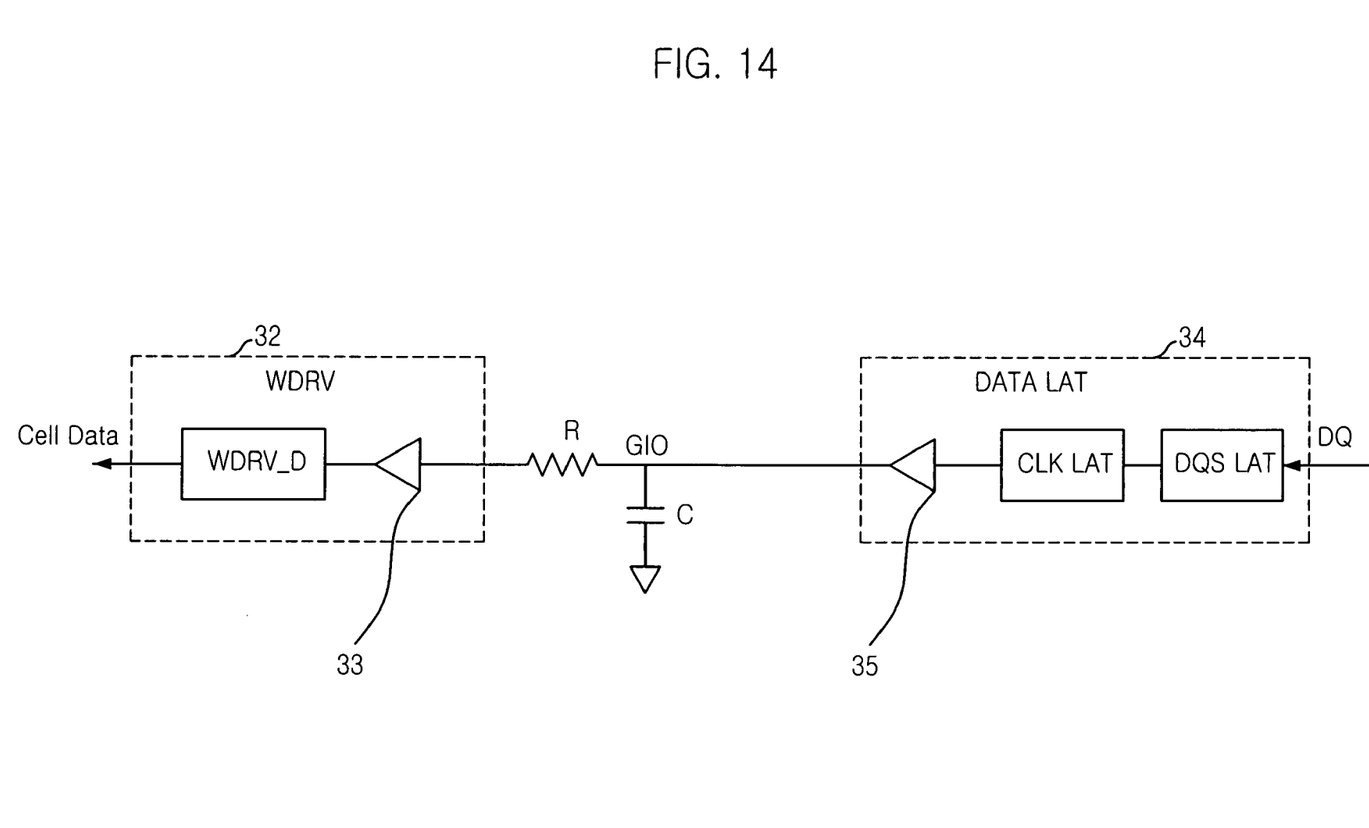
FIG. 14 is a block diagram setting forth a write bus driving circuit in accordance with the present invention.

FIG. 14 is a block diagram setting forth the semiconductor memory device incorporating therein a write GIO bus in accordance with the present invention.

In FIG. 14, the core area of a write GIO bus having a resistor with a predetermined resistance R and a capacitor with a predetermined capacitance C is connected to a write driver 32 and a peripheral area thereof is connected to a write latch 24. Meanwhile, the write driver 32 is provided with a driver module WDRV_D connected to the core area for outputting the data applied to a data line in the core, and a line receiver 33 for sensing the data applied to the GIO bus. The driving voltage is applied to each of elements depicted in FIG. 14. In detail, in order to raise operational stability of the write driver 32 and the write latch 34, the driving voltage is applied to all the elements required for the power voltage at the write driver 32 and the write latch 34. Alternatively, the driving voltage may be applied only to the line driver 33 and the line receiver 35.

Meanwhile, the GIO bus voltage generator may be implemented as two voltage generators, i.e., a first voltage generator for the core area and a second voltage generator for the peripheral area. Alternatively, the GIO bus voltage generator may be implemented as a first voltage generator for read path which applies the driving voltage to elements in the read GIO bus driving circuit and a second voltage generator for write path that applies the driving voltage to elements in the write GIO bus driving circuit. Herein, the GIO bus may be configured with a read GIO bus and a write GIO bus, and alternatively may be configured with a common GIO bus for read/write path.

The IO bus driving circuit of the present invention provides an advantageous merit that it is possible to secure an adequate operation to transfer a burst data with high compression rate and to reduce power consumption. In addition, the GIO bus driving circuit is independent from an external power source so that power consumption during an operation of the GIO bus does not affect on operations of internal circuit elements and further a driving environment of the GIO bus is not affected from noise of the other external elements.

The present application contains subject matter related to the Korean patent application No. KR 2004-87673, filled in the Korean Patent Office on Oct. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A power supply control circuit of a semiconductor memory device, comprising:
    an input/output (I/O) bus voltage generating unit for supplying a power supply voltage to an I/O bus in response to a power supply enable signal;
    a setting signal generator for outputting a setting signal to set the power supply enable signal in response to a read command signal or a write command signal wherein the setting signal generator is enabled in response to a row active signal;
    a counting means which is reset in response to the read command signal or the write command signal to count an input clock and then, to output a counting completion signal; and
    a power supply enable signal generation means enabled in response to the read command signal or the write command signal and disabled in response to the counting completion signal, for generating the power supply enable signal.

2. The power supply control circuit as recited in claim 1, further comprising a counter controller for outputting a counter control signal to control the counting means.

3. The power supply control circuit as recited in claim 2, wherein the counting means is reset to stop a counting operation when the counter control signal is in a first logic level, and the counting means counts the input clock when the counter control signal is in a second logic level.

4. The power supply control circuit as recited in claim 2, wherein the counter controller includes:
    a NOR gate receiving the read command signal and the write command signal; and
    an NAND gate receiving an output signal of the NOR gate and the power supply enable signal to output the counter control signal.

5. The power supply control circuit as recited in claim 1, wherein the power supply enable signal generation means includes a set-reset (SR) latch to output the power supply enable signal.

6. The power supply control circuit as recited in claim 5, wherein the power supply enable signal generation means includes:
a reset signal generator for outputting a reset signal to reset the power supply enable signal generation means in response to the counting completion signal.

7. The power supply control circuit as recited in claim 6, wherein the reset signal generator outputs the reset signal activated in synchronization with a rising edge of the counting completion signal.

8. The power supply control circuit as recited in claim 7, wherein the reset signal generator includes:
an inverter receiving the counting completing signal;
a delay unit for delaying an output signal of the inverter by a predetermined time; and
a NAND gate for performing a logic NAND operation to the counting completing signal and an output signal of the delay unit so as to output the reset signal.

9. The power supply control circuit as recited in claim 6, wherein the setting signal generator includes:
a NOR gate for performing a logic NOR operation to the read command signal and the write command signal;
an inverter receiving an output signal of the NOR gate;
a NAND gate receiving the row active signal and an output signal of the inverter; and
a delay unit for delaying an output signal of the NAND gate by a predetermined time to output the setting signal.

10. The power supply control circuit as recited in claim 1, wherein the counting means is a variable counter capable of adjusting a counting number of the input clock.

11. The power supply control circuit as recited in claim 10, wherein the counting means includes:
a clock divider for dividing a frequency of the input clock by a predetermined multiple; and
an output selector for selecting one among output signals of the clock divider.

12. The power supply control circuit as recited in claim 11, wherein the clock divider includes N number of divider stages, each of said N number of divider stages being provided with an inverter and a flip-flop so that an output clock divided by 2n is outputted finally, where N is a positive integer.

13. The power supply control circuit as recited in claim 12, wherein the Nth flip-flop includes a data output terminal for outputting the divided clock, a data input terminal for receiving an inverted output value of the data output terminal, and a clock input terminal for receiving a count clock in case of N being 1 or an output of an N-1th divider stage in case of N being higher than 1.

14. The power supply control circuit as recited in claim 13, wherein the flip-flop includes:
an input latch for latching a data received through the data input terminal;
an output latch for latching a data to be outputted through the data output terminal;
a first pass gate for connecting the data input terminal to the input latch when the count clock is in a first logic level; and
a second pass gate for connecting the output latch to the data output terminal when the count clock is in a second logic level, whereby the input latch is reset to a predetermined logic level depending on the counter control signal.

15. A method for controlling a power supply circuit, comprising:
a) receiving a read command or a write command in response to a row active signal;
b) performing a counting operation for an input clock after receiving the read command or the write command;
c) activating a power supply enable signal after receiving the read command or the write command;
d) deactivating the power supply enable signal after finishing the counting operation; and
e) supplying a power supply voltage to an input/output (I/O) bus in response to the power supply enable signal.

16. A method for controlling a power supply circuit, comprising:
a) receiving a read command in response to a row active signal;
b) performing a counting operation for an input clock after receiving the read command;
c) activating a power supply enable signal after receiving the read command;
d) receiving a write command in response to a row active signal;
e) resetting the counting operation and performing the counting operation again;
f) deactivating the power supply enable signal after finishing the counting operation for the write command;
g) supplying a power supply voltage to an input/output (I/O) bus in response to the power supply enable signal.

* * * * *